(12) United States Patent
Petti et al.

(10) Patent No.: US 10,354,710 B2
(45) Date of Patent: Jul. 16, 2019

(54) MAGNETOELECTRIC RANDOM ACCESS MEMORY ARRAY AND METHODS OF OPERATING THE SAME

(71) Applicant: SANDISK TECHNOLOGIES LLC, Plano, TX (US)

(72) Inventors: Christopher Petti, Mountain View, CA (US); Neil Robertson, Palo Alto, CA (US); Abhijit Bandyopadhyay, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 3 days.

(21) Appl. No.: 15/728,840

(22) Filed: Oct. 10, 2017

(65) Prior Publication Data

US 2019/0027201 A1    Jan. 24, 2019

Related U.S. Application Data

(60) Provisional application No. 62/536,283, filed on Jul. 24, 2017.

(51) Int. Cl.
*G11C 11/16* (2006.01)
*G11C 11/02* (2006.01)

(52) U.S. Cl.
CPC ........ *G11C 11/1673* (2013.01); *G11C 11/161* (2013.01); *G11C 11/1657* (2013.01); *G11C 11/1659* (2013.01); *G11C 11/1675* (2013.01); *G11C 11/16* (2013.01); *G11C 11/1655* (2013.01)

(58) Field of Classification Search
CPC .............. G11C 11/1673; G11C 11/161; G11C 11/1655; G11C 11/1657

USPC .......................................................... 365/145
See application file for complete search history.

(56) References Cited

U.S. PATENT DOCUMENTS

| | | | | |
|---|---|---|---|---|
| 8,724,369 | B2 * | 5/2014 | Zhang | H01L 45/08 365/148 |
| 9,230,625 | B2 * | 1/2016 | Inokuchi | G11C 11/161 |
| 2008/0310219 | A1 * | 12/2008 | Chen | G11C 11/16 365/173 |
| 2009/0016094 | A1 * | 1/2009 | Rinerson | G11C 11/5685 365/148 |
| 2012/0230089 | A1 * | 9/2012 | Yamada | G11C 11/16 365/158 |
| 2012/0268986 | A1 * | 10/2012 | Ogimoto | H01L 27/224 365/173 |

(Continued)

FOREIGN PATENT DOCUMENTS

WO    WO2016114718 A1    7/2016
WO    WO2016153515 A1    9/2016

OTHER PUBLICATIONS

Lee, H. et al., "Source Line Sensing in Magneto-Electric Random-Access Memory to Reduce Read Disturbance and Improve Sensing Margin," IEEE Magnetics Letters, vol. 7, pp. 1-5, 2016.

(Continued)

*Primary Examiner* — Ly D Pham
(74) *Attorney, Agent, or Firm* — The Marbury Law Group, PLLC

(57) ABSTRACT

A memory cell includes a VCMA magnetoelectric memory element and a two-terminal selector element connected in series to the magnetoelectric memory element.

12 Claims, 14 Drawing Sheets

(56) References Cited

U.S. PATENT DOCUMENTS

| | | | |
|---|---|---|---|
| 2012/0314477 A1* | 12/2012 | Siau | G11C 8/08 |
| | | | 365/148 |
| 2013/0148409 A1* | 6/2013 | Chung | G11C 17/18 |
| | | | 365/148 |
| 2014/0071728 A1 | 3/2014 | Amiri et al. | |
| 2014/0071732 A1* | 3/2014 | Khalili Amiri | G11C 11/161 |
| | | | 365/145 |
| 2015/0249096 A1 | 9/2015 | Lupino et al. | |
| 2015/0263069 A1 | 9/2015 | Jo | |
| 2017/0117027 A1* | 4/2017 | Braganca | G11C 11/161 |
| 2017/0178705 A1* | 6/2017 | Buhrman | H01L 43/08 |
| 2017/0220301 A1* | 8/2017 | Nobunaga | G06F 3/0679 |
| 2017/0243923 A1* | 8/2017 | Jeong | G11C 13/0004 |
| 2017/0244031 A1* | 8/2017 | Jeong | H01L 45/04 |
| 2017/0263314 A1* | 9/2017 | Apodaca | G11C 13/0069 |
| 2018/0040669 A1* | 2/2018 | Wu | H01L 23/528 |
| 2018/0122825 A1* | 5/2018 | Lupino | G11C 11/1653 |

OTHER PUBLICATIONS

Grezes, C. et al., "Ultra-low switching energy and scaling in electric-field-controlled nanoscale magnetic tunnel junctions with high resistance-area product," Appl. Phys. Lett., vol. 108, No. 1, p. 012403, Jan. 2016.

Kanai, F. et al., "Electric-field-induced magnetization switching in CoFeB/MgO magnetic tunnel junctions with high junction resistance," Appl. Phys. Lett., vol. 108, No. 19, p. 192406, May 2016.

Matic, D. S., "A Magnetic Tunnel Junction Compact Model for STT-RAM and MeRAM," 2013, Requirement for the Degree Master of Science in Electrical Engineering, Available at http://kodiak.ee.ucla.edu/cite/pdf/A%20Magnetic%20Tunnel%20Junction%20Compact%20Model%20for%20STT-RAM%20and%20MeRAM%20-%20Daniel%20Scott%20Matic.pdf.

Atwood, G., "Current and Emerging Memory Technology Landscape," Micron Technology, www.micron.com/fms Flash Memory Summit 2011, Santa Clara, CA, 24 pages, (2011).

International Search Report and Written Opinion of the International Search Authority for International Patent Application No. PCTUS2018/033220, dated Aug. 29, 2018, 19 pages.

Amiri, P.K. et al., "Electric-Field-Controlled Magnetoelectric RAM: Progress, Challenges, and Scaling," IEEE Transactions on Magnetics, vol. 51, No. 11, pp. 1-7, XP011587641, (2015).

Wang, K. L. et al., "Electric-Field Control of Spin-Orbit Interaction for Low-Power Spintronics," Proceedings of the IEEE, vol. 104, No. 10, pp. 1974-2008, XP011623641, (2016).

Kang, W. et al., "Modeling and Exploration of the Voltage-Controlled Magnetic Anisotropy Effect for the Next-Generation Low-Power and High-Speed MRAM Applications," IEEE Transaction on Nanotechnology, vol. 16, No. 3, pp. 387-395, XP011649388, (2017).

* cited by examiner

MAGNETOELECTRIC RANDOM ACCESS MEMORY ARRAY AND METHODS OF OPERATING THE SAME

FIELD

The present disclosure relates generally to the field of solid state memory devices and specifically to a magnetoelectric random access memory (MeRAM) array and methods of operating the same.

BACKGROUND

Magnetoelectric memory devices are known in the art. Exemplary discrete magneto-resistive memory devices are disclosed, for example, in C. Grezes et al., Ultra-low switching energy and scaling in electric-field-controlled nanoscale magnetic tunnel junctions with high resistance-area product, Appl. Phys. Lett. 108, 012403 (2016); and S. Kanai, Electric-field-induced magnetization switching in CoFeB/MgO magnetic tunnel junctions with high junction resistance, Appl. Phys. Lett. 108, 192406 (2016). An array of magnetoelectric memory devices is disclosed, for example, in Hochul Lee et al., Source Line Sensing in Magneto-Electric Random-Access Memory to Reduce Read Disturbance and Improve Sensing Margin, IEEE Magnetics Letters, Vol. 7, 3103405 (2016).

SUMMARY

According to an aspect of the present disclosure, a memory cell includes a VCMA magnetoelectric memory element and a two-terminal selector element connected in series to the magnetoelectric memory element.

According to another aspect of the present disclosure, a method of operating a memory cell comprising a two-terminal selector element connected in series to a magnetoelectric memory element comprising a magnetic tunnel junction, the method comprises switching a magnetization of a free layer of the magnetic tunnel junction from a parallel state with respect to a magnetization of a reference layer of the magnetic tunnel junction to an antiparallel state by application of a first voltage pulse of a first polarity, and switching the magnetization of the free layer from the antiparallel state to the parallel state by application of a second voltage pulse of the first polarity.

According to another aspect of the present disclosure, a memory array comprises a plurality of memory cells, a plurality of word lines, and a plurality of bit lines, wherein each memory cell comprises a magnetoelectric memory element connected in series to a two-terminal selector element, each of the plurality of memory cells is connected to a respective one of the plurality of word lines and a respective one of the plurality of bit lines, each magnetoelectric memory element comprises a magnetic tunnel junction in which a magnetization of a free layer is in a parallel state or in an antiparallel state with respect to a magnetization of a reference layer. The method of operating the array comprises switching a magnetization of a free layer in a first selected magnetoelectric memory element from a parallel state to an antiparallel state by application of a first voltage pulse of a first polarity between a word line connected to the first selected magnetoelectric memory element and a bit line connected to the first selected magnetoelectric memory element, and reading a magnetization of the free layer in the first selected magnetoelectric memory element by applying a read voltage of a second polarity opposite to the first polarity between the word line connected to the first selected magnetoelectric memory element and the bit line connected to the first selected magnetoelectric memory element.

DETAILED DESCRIPTION

As discussed above, the present disclosure is directed to a two-dimensional magnetoelectric random access memory (MeRAM) array and methods of operating the same, the various aspects of which are described below. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

Figure 1:
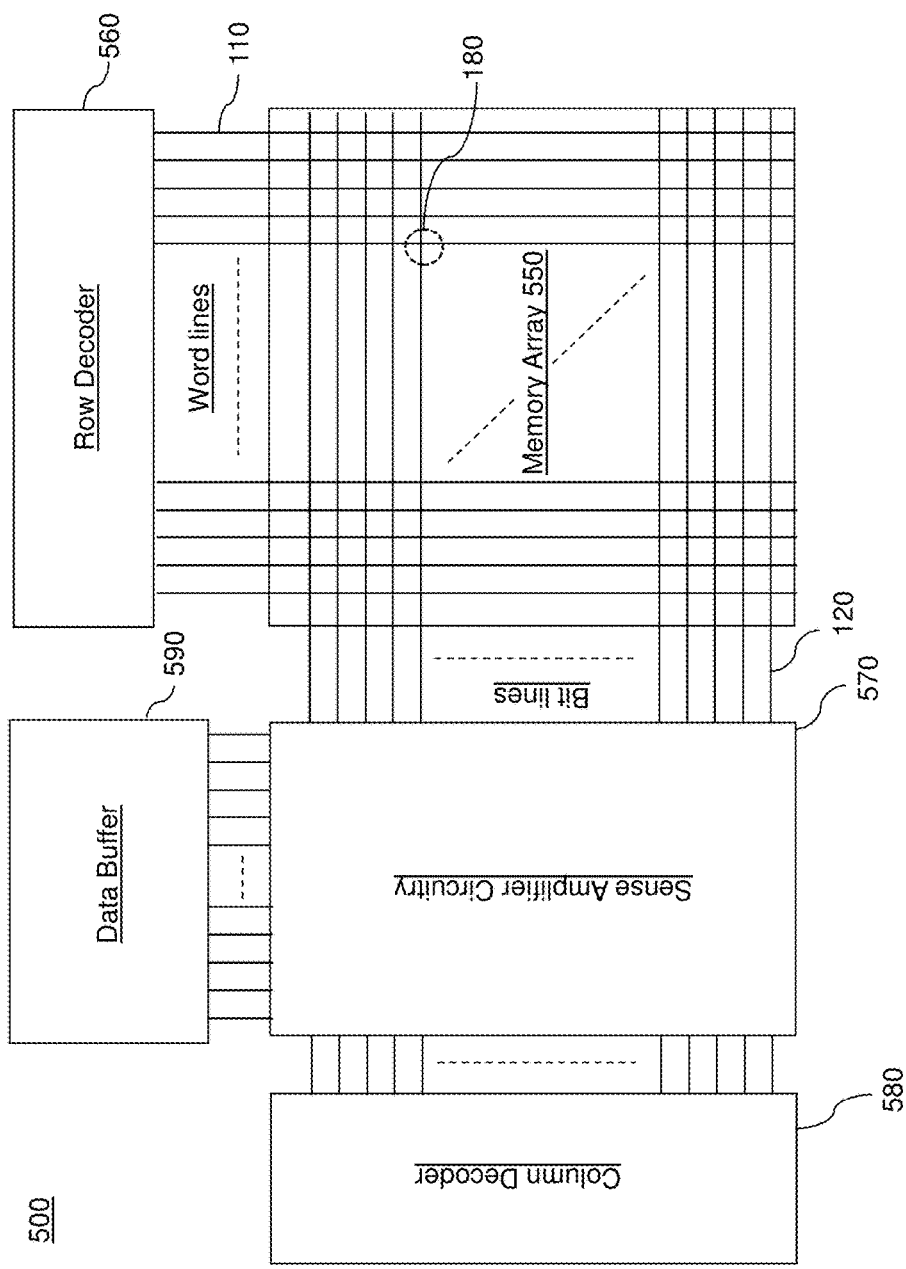
FIG. 1 is a schematic diagram of a memory device including memory cells of the present disclosure in an array configuration.

Referring to FIG. 1, a schematic diagram is shown for a non-volatile memory device including non-volatile memory cells of the present disclosure in an array configuration. The non-volatile memory device can be configured as a magneto-resistive random access memory (MRAM) device, such as a magnetoelectric random access memory (MeRAM) device which is a type of MRAM device. As used herein, a "random access memory device" refers to a memory device including memory cells that allow random access, i.e., access to any selected memory cell upon a command for reading the contents of the selected memory cell. As used herein, a "magneto-resistive random access memory device" refers to a random access memory device in which the memory cells include a magneto-resistive memory element.

The magneto-resistive random access memory device 500 of the present disclosure includes a memory array region 550 containing an array of the respective memory cells 180 located at the intersection of the respective word lines (which may be embodied as first electrically conductive lines 110 as illustrated or as second electrically conductive lines 120 in an alternate configuration) and bit lines (which may be embodied as second electrically conductive lines 120 as illustrated or as first electrically conductive lines 110 in an alternate configuration). The device 500 may also contain a row decoder 560 connected to the word lines, sense circuitry 570 (e.g., a sense amplifier and other bit line control circuitry) connected to the bit lines, a column decoder 580 connected to the bit lines and a data buffer 590 connected to the sense circuitry. Multiple instances of the magneto-resistive memory cells 180 are provided in an array configuration that forms the random access memory device 500. It should be noted that the location and interconnection of elements are schematic and the elements may be arranged in a different configuration.

Each magneto-resistive memory cell 180 includes memory cell includes a series connection of a magnetoelectric memory element and a two-terminal selector element. The magneto-resistive memory element is provided between a first electrode and a second electrode within each magneto-resistive memory cell 180. Configurations of the magneto-resistive memory cells 180 are described in detail in subsequent sections.

The sense circuitry 570 includes sense amplifier circuitry (e.g., a "sense amp"). The sense circuitry is configured to measure a resistive state of each of the magneto-resistive memory cells 180 through respective bit lines. For example, the sense amplifier circuitry can be configured to detect a magneto-resistive state of each magneto-resistive memory cell 180 within the array of magneto-resistive memory cells based on measurement of electrical current through a respective magneto-resistive memory cell 180 upon application of a read bias voltage to the array of magneto-resistive memory cells 180.

Figure 2A:
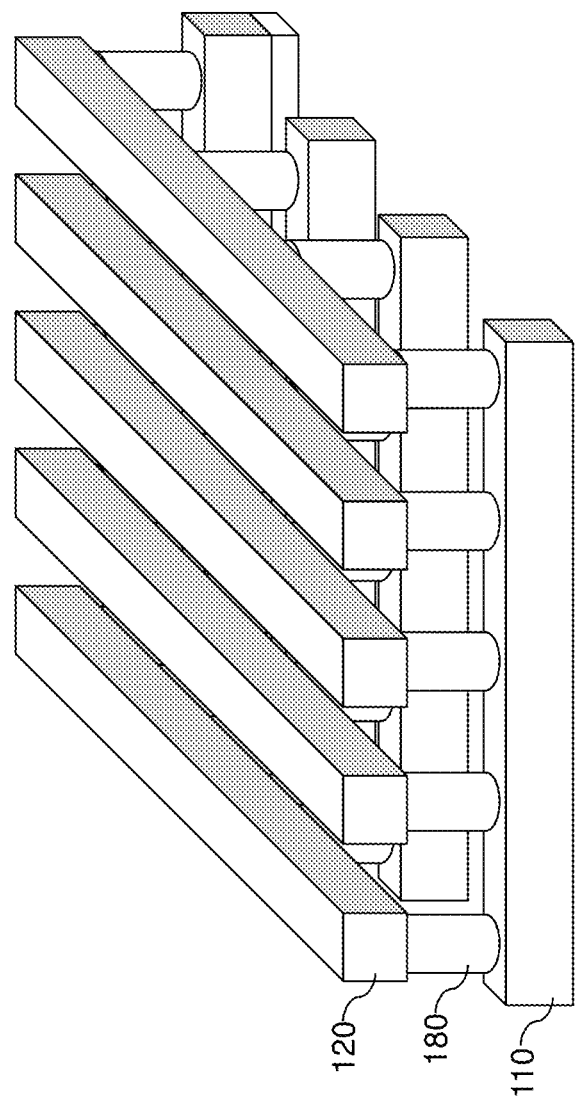
FIG. 2A is a schematic perspective view of a first exemplary memory array according to an embodiment of the present disclosure.
Figure 2B:
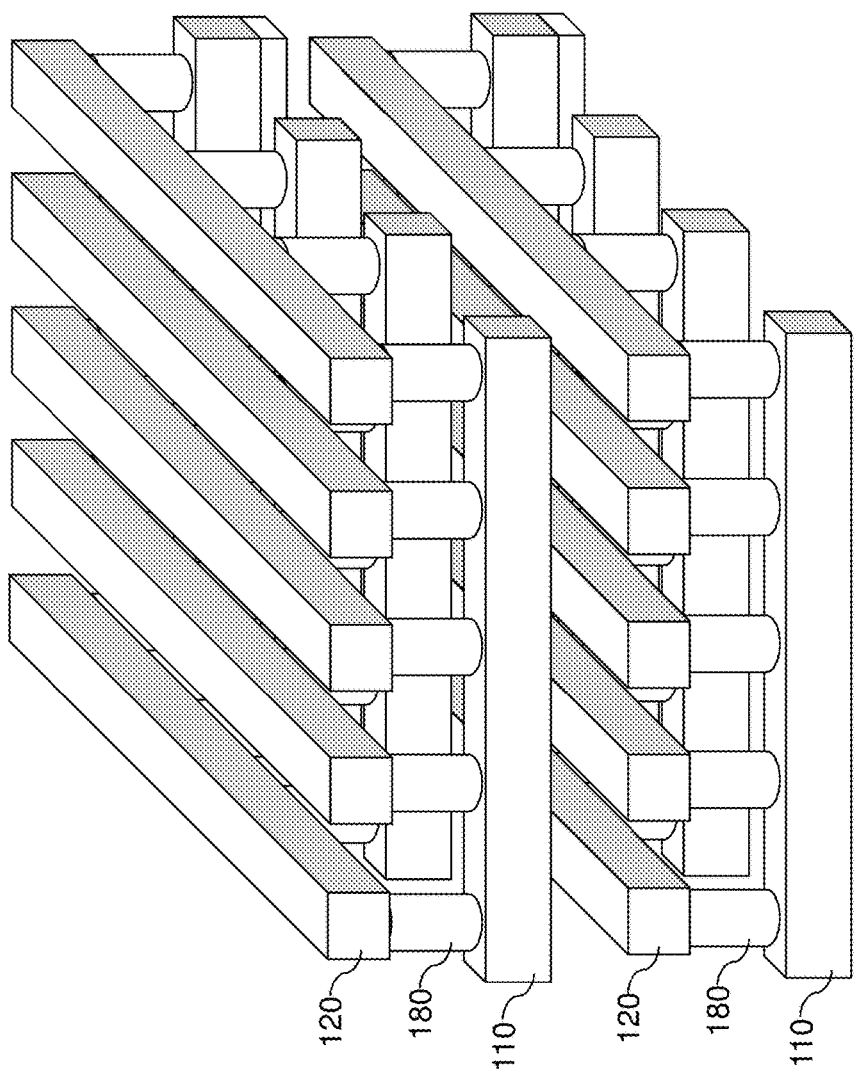
FIG. 2B is a schematic perspective view of a second exemplary memory array according to an embodiment of the present disclosure.
Figure 2C:
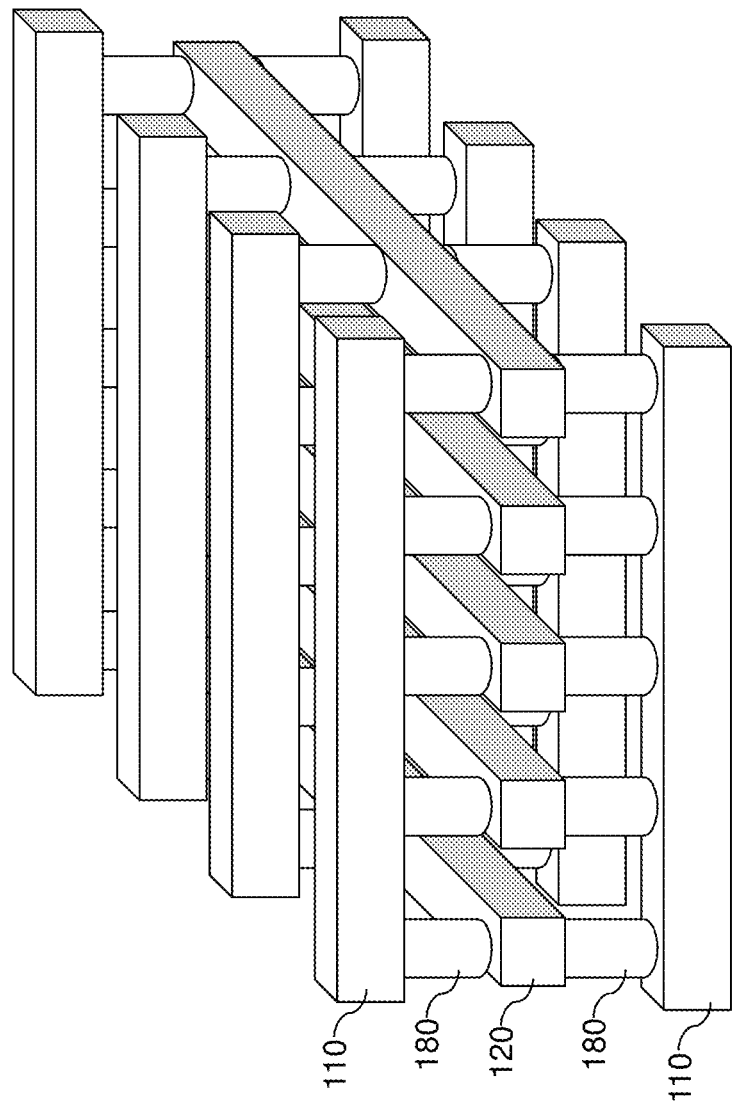
FIG. 2C is a schematic perspective view of a third exemplary memory array according to an embodiment of the present disclosure.
Figure 3:
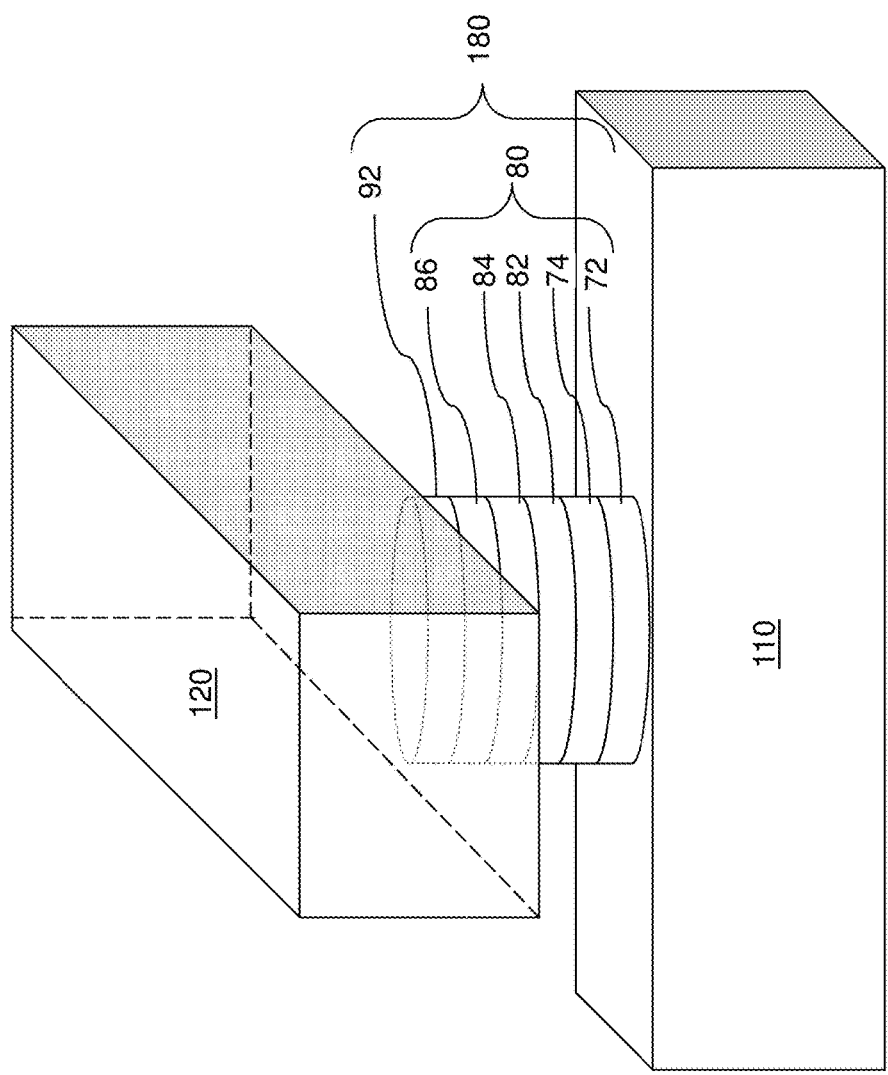
FIG. 3 is a perspective view of a region around a memory cell of any of the first, second, and third exemplary memory arrays of FIGS. 2A-2C.
Figure 4:
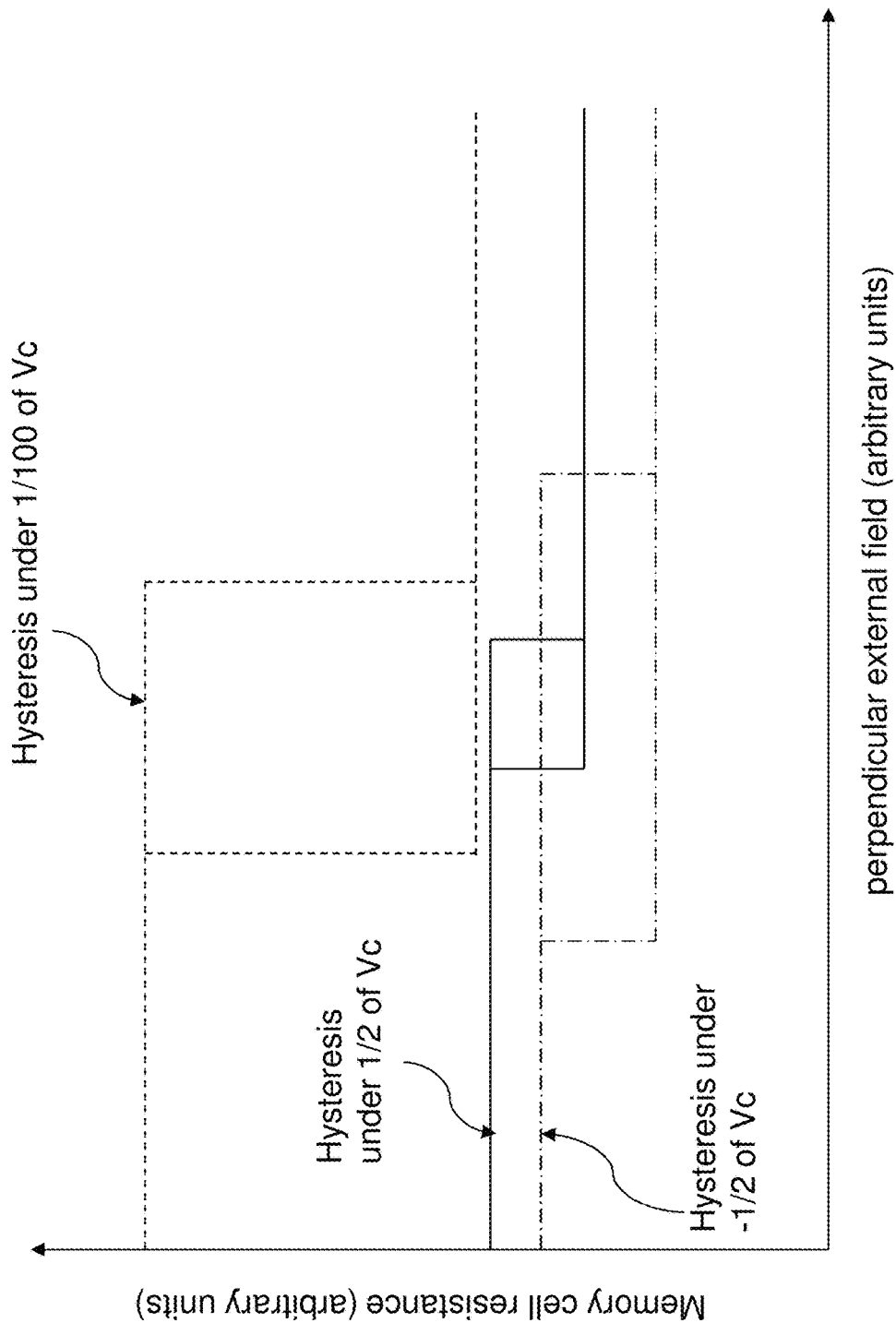
FIG. 4 is a schematic diagram of the memory cell resistance of the present disclosure as a function of a perpendicular external field according to an embodiment of the present disclosure.

FIGS. 2A, 2B, and 2C illustrate first, second, and third exemplary memory arrays, respectively, according to embodiments of the present disclosure. FIG. 3 illustrates a region around a memory cell 180, which can be a region of any of the first, second, and third exemplary memory arrays shown in FIGS. 2A, 2B, and 2C. FIG. 4 illustrates a circuit schematic of a two-dimensional memory array included in each of the first, second, and third exemplary memory arrays shown in FIGS. 2A, 2B, and 2C.

Each two-dimensional memory array comprises a plurality of word lines 110 and a plurality of bit lines 120 arranged in a criss-cross (i.e., cross point) configuration. The plurality of word lines 110 can be embodied as first conductors extending along a first direction. The plurality of bit lines 120 can be embodied as second conductors extending along a second direction, which is different from (e.g., perpendicular to) the first direction. The plurality of word lines 110 and the plurality of bit lines 120 can be offset along a direction (e.g., vertical direction) that is perpendicular to the first direction and the second direction to define a spacing.

A memory cell 180 is located between each intersection region, or an "intersection point," at which a separation distance between a word line 110 and a bit line 120 becomes the spacing. The spacing is the height of a two-dimensional array of memory cells 180. The memory cell 180 can have a pillar configuration, in which multiple layers having a substantially same horizontal cross-sectional shape are present. Alternatively, the layers in the pillar may have different cross sectional shapes and/or sizes.

The memory cells can be formed by depositing each of the multiple layers as a continuous unpatterned layer, and by anisotropically etching the stack of multiple layers into an array of pillar structures. Alternatively, the memory cells may be formed by a damascene process by depositing the cell layers in an opening in an insulating layer. The memory cells 180 can be provided as a two-dimensional array as illustrated in FIG. 2A, or can be provided as a stack of two-dimensional arrays that constitute a three-dimensional array as illustrated in FIGS. 2B and 2C. For example, as shown in FIG. 2B, each vertical device level may be its own separate word lines 110 and bit lines 120 and the levels may be separated by an insulating layer (not shown for clarity). Alternatively, as shown in FIG. 2C, the device levels may have a mirrored configuration in which adjacent device levels share a set of bit lines or word lines.

Each memory cell 180 is connected to a respective one of the plurality of bit lines 120 and a respective one of the plurality of word lines 110 at each intersection region of the two-dimensional memory array. As shown in FIG. 3, each memory cell 180 includes series connection of a magnetic tunnel junction (82, 84, 86), such as a magnetoelectric tunnel junction (MeTJ) and a two-terminal selector element 92. Each memory cell may also have one or more magnetic pinning layers which pin a fixed reference layer 82 of the junction. The pinning layers may include a ferromagnetic pinning layer 72 and an optional diamagnetic or antiferromagnetic coupling layer 74 located between the ferromagnetic pinning layer 72 and the fixed reference layer 82. The magnetic tunnel junction (82, 84, 86), the optional coupling layer 74, and the ferromagnetic pinning layer 72 collectively constitute a magnetoelectric memory element 80.

The ferromagnetic pinning layer 72 may comprise a stack of layers, such as stack of 6 to 10 alternating cobalt and platinum layers having a thickness on 0.3 to 0.4 nm. The optional coupling layer 74 may be a 0.2 to 0.3 nm thick tantalum layer. Any other suitable layer materials and thicknesses instead of and/or in addition to the ones described above may be used to pin the fixed reference layer 82.

Each magnetic tunnel junction (82, 84, 86) includes a ferromagnetic free (unpinned) layer 86, an insulating tunneling oxide layer 84, and a ferromagnetic fixed reference (pinned) layer 82. The reference layer 82 has a fixed magnetization direction. The direction of magnetization of the reference layer 82 can be fixed, for example, by a combination of a ferromagnetic layer 72, and an antiferromagnetic coupling layer 74. For example, the ferromagnetic layer 72 can include a permanent magnet having a magnetization direction that is parallel to the height direction of the pillar, and thus, perpendicular to the interface between the free layer 86 and the insulating tunneling oxide layer 84. In one embodiment, the magnetization of the free layer 86 can be antiparallel to the magnetization of the reference layer 82. The thickness of the antiferromagnetic coupling layer 74 can be selected such that the magnetization of the reference layer 82 is antiparallel to the magnetization of the ferromagnetic layer 72. Thus, the magnetization of the reference layer 82 can be perpendicular to the interface between the free layer 86 and the insulating tunneling oxide layer 84. For example, the reference layer 82 can include CoFeB layer having a thickness in a range from 1 nm to 2 nm. In one embodiment, the magnetic moment of the reference layer 82 can be chosen such that essentially no net perpendicular magnetic field is present at the free layer 86.

The insulating tunneling oxide layer 84 allows passage of leakage current therethrough, for example, for measurement of resistance of the magnetic tunnel junction (82, 84, 86), and thus, determination of the alignment of the magnetization of the free layer 86 with respect to the reference layer 82. Magnetic anisotropy in the free layer 86 provides an easy axis of magnetization, which enables two stable states for the free magnetic layer 86. When the magnetization of the free layer 86 is parallel to the magnetization of the reference layer 82, a low resistance state having a low resistance $R_P$ results. When the magnetization of the free layer 86 is antiparallel to the magnetization of the reference layer 82, a high resistance state having a high resistance $R_{AP}$ results. The tunneling magnetoresistance ratio, which is defined as $(R_{AP}/R_P)-1$, is a measure of performance metric for the magnetic tunnel junction (82, 84, 86), and affects the sensing margin and error rates directly. According to an aspect of the present disclosure, the thickness of the insulating tunneling oxide layer 84 is selected such that spin torque transfer (STT) effect is insignificant relative to the precession of magnetization of the free layer 86 about an in-plane (within the plane of the interface between the free layer 86 and the insulating tunneling oxide layer 84) axis under an applied electrical bias voltage that will be described below. For example, the insulating tunneling oxide layer 84 can include an MgO layer. The MgO layer 84 preferably has a thickness greater than 1.2 nm to reduce the switching energy, such as a thickness in a range from 1.3 nm to 3 nm, such as from 1.4 nm to 1.7 nm.

The free layer 86 has perpendicular magnetic anisotropy. Thus, the easy axis of magnetization is perpendicular to the interface between the free layer 86 and the tunneling oxide layer 84. In configurations in which the interface between the free layer 86 and the tunneling oxide layer 84 is horizontal, the magnetization of the free layer 86 may be along an "up" direction, or along a "down" direction, i.e., one of the two vertical directions. The magnetic tunnel junction (82, 84, 86) can be formed with built-in asymmetry along the vertical direction. In this case, the perpendicular magnetic anisotropy (PMA) can include a constant term that is independent of applied voltage across the free layer 86 and the reference layer 82, and an odd term of significant magnitude (with respect to the constant term) that is proportional to the applied voltage across the free layer 86 and the reference layer 82. In other words, the perpendicular magnetic anisotropy can be significantly increased or decreased by applying an external bias voltage of a suitable polarity across the free layer 86 and the reference layer 82. In an illustrative example, the free layer 86 can include a CoFeB layer. Preferably, the free layer 86 has a thickness of less than 1.4 nm, such as a thickness in a range from 0.9 nm to 1.3 nm to permit the electric field to penetrate it during operation, although lesser and greater thicknesses can also be employed.

The vertical magnetoelectric memory element 80 is exemplary and can be configured horizontally instead of vertically. In an alternative embodiment, the free layer 86 may be located below the reference layer 82 rather than above it, and the ferromagnetic pinning layer 72 may be located above the reference layer 82. Furthermore, in an alternative embodiment, the selector element 92 may be located below the memory element 80 rather than above it.

The magnetoelectric memory element 80 is preferably written by the voltage controlled magnetic anisotropy (VCMA) effect, and the memory cell 180 is a VCMA memory cell which is written in one direction. In other words, a voltage is applied between a selected word line and a selected bit line, and the VCMA MeRAM cell 180 is toggled back and forth between the parallel and anti-parallel states by pulsing a voltage in one direction (e.g., in forward bias mode), such as by applying a negative voltage polarity to the free layer 86 and a positive voltage polarity to the reference layer 82. In one embodiment, a very small current may flow between the free layer 86 and the reference layer 82 during the writing step. However, the current is typically so small that STT effects can be ignored, and ohmic dissipation should be minimal which reduces the write power. In contrast, a larger current may flow between the free layer 86 and the reference layer 82 through the insulating tunneling oxide layer 84 during the reading operation.

Referring to FIG. 4, the dependence of the perpendicular magnetic anisotropy on the external bias voltage is illustrated by the changes in coercivity (i.e., the magnetic field strength along the perpendicular direction that is required to change the magnetization of the free layer) between the parallel state and the antiparallel state as a function of the applied external bias voltage. A critical voltage Vc is a forward bias voltage above which precession of the magnetization of the free layer 86 can occur. When the applied external voltage is a reverse bias voltage or a forward bias voltage with a magnitude less than the critical voltage Vc, precession of the magnetization of the free layer 86 does not occur or do not induce transition of the magnetization between the parallel state and the antiparallel state. When the applied external voltage is a forward bias voltage with a magnitude greater than the critical voltage Vc, precession of the magnetization of the free layer 86 induces transition of the magnetization between the parallel state and the antiparallel state and vise-versa.

In FIG. 4, the applied external voltages are a forward bias voltage of 1/100 of the critical voltage, a forward bias voltage of ½ of the critical voltage, and a reverse bias voltage having a magnitude of ½ of the critical voltage. The change in the coercivity in response to the applied external voltages illustrate that the coercivity decreases under the forward bias conditions, thereby making the transition between the parallel state and the antiparallel state easier, and the coercivity increases under the reverse bias conditions, thereby making the transition between the parallel state and the antiparallel state more difficult.

Figure 5:
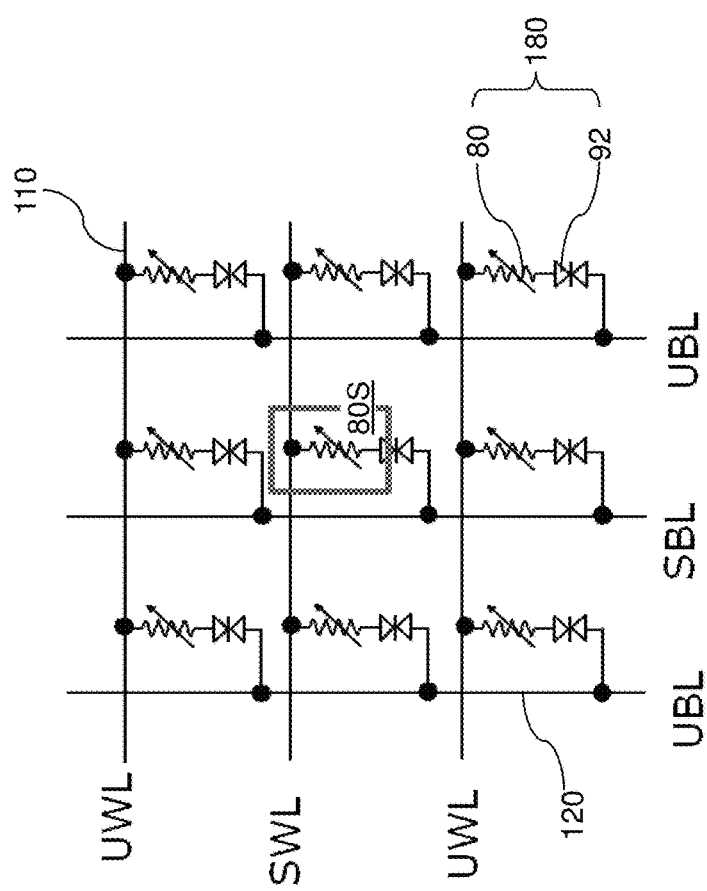
FIG. 5 is a schematic circuit diagram of the exemplary memory arrays of the present disclosure.

Referring to FIG. 5, the present inventors recognized that the forward bias conditions can be employed to facilitate switching (i.e., writing) of the magnetization state of the free layer 86 in a selected magnetic tunnel junction 80S (which is located in a selected memory cell 180 within a two-dimensional array at the intersection of the selected word line SWL and the selected bit line SBL), and the reverse bias conditions can be employed to sense (i.e., read) the magnetization state of the free layer 86 in the selected magnetic tunnel junction 80S. During the reading operation, the two-terminal selector elements 92 prevent writing and/or disturbing of the unselected memory cells 180 which are located at the intersection of an unselected word line (UWL) and either the selected or unselected bit line, or at the intersection of an unselected bit line (UBL) and either the selected or unselected word line.

For example, referring to FIG. 5, a first inhibit voltage can be applied to each of unselected word lines UWL (110) during switching and sensing, and a second inhibit voltage can be applied to each of unselected bit lines UBL (120) during switching and sensing. During programming, the first inhibit voltage can be in a range from 0.4 V to 1.2 V, such as 0.6 V and the second inhibit voltage can be in a range from 0.4 V to 1.2 V, such as 0.6 V. The second inhibit voltage may be the same as, higher than, or lower than the first inhibit voltage. The selected word line SWL and the selected bit line SBL can be biased to provide the optimal programming pulse voltage, which is greater than the turn-on voltage of the two-terminal selector elements 92. For example, the selected bit line SBL can be biased at 0 V, and the selected word line SWL can be biased with a positive voltage pulse of a magnitude in a range from 1.0 V to 2.5 V, such as 1.2 V for both the reset operation (i.e., parallel to anti-parallel magnetic state) and the set operation (i.e., anti-parallel to parallel magnetic state). The pulse duration can be on the order of a nanosecond.

During reading, the first inhibit voltage can be in a range from 0.3 V to 1.0 V, such as 0.45 V to 5 V, and the second inhibit voltage can be in a range from 0.3 V to 1.0 V, such as 0.45 V to 5 V. The second inhibit voltage may be the same as, higher than, or lower than the first inhibit voltage. The first and second inhibit voltages during sensing may be the same as, or different from, the first and second inhibit voltages during programming, respectively. If all inhibit voltages are the same, then this will save time switching from read to write, since a read-before-write can be used for every write (to determine whether or not to send the write pulse). The selected word line SWL and the selected bit line SBL can be biased to provide the optimal reading voltage, which does not have a time limit as in the case of the programming pulses. For example, the selected bit line SBL can be biased at a voltage in a range from 0.7 V to 2.0 V, such as 0.9 V to 1 V, and the selected word line SWL can be biased with 0 V.

Figure 6A:
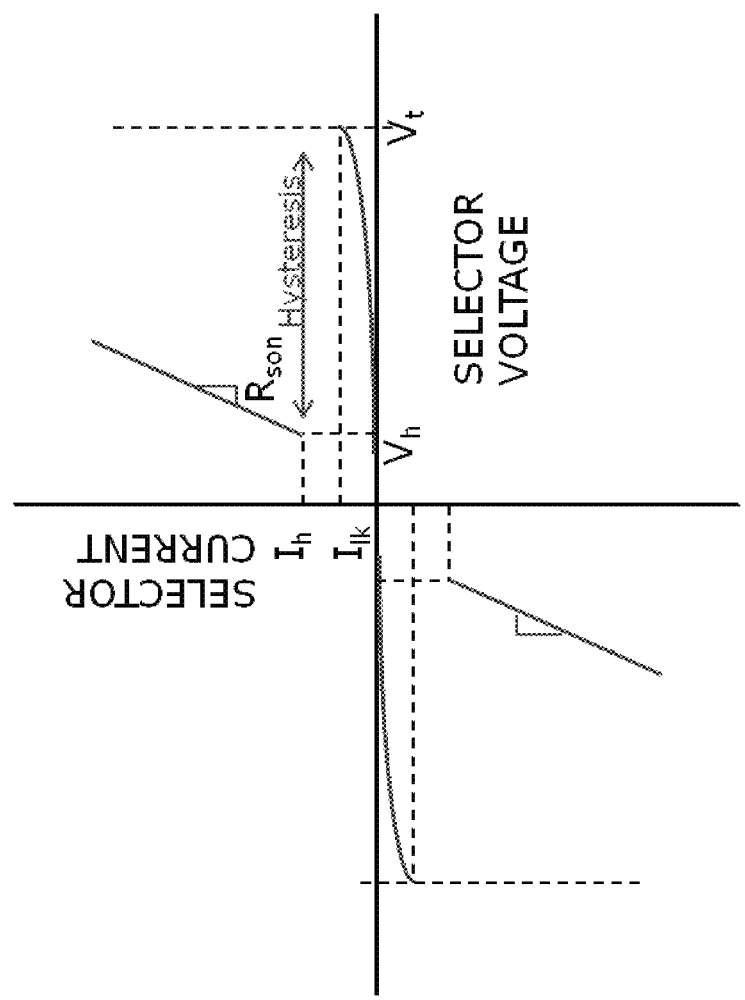
FIGS. 6A, 6B and 6C are schematic voltage-current plot of a selector of a prior art STT MRAM device.

FIG. 6A illustrates a selector current-voltage plot of a two terminal selector for a prior art spin transfer torque ("STT") type MRAM device. The STT MRAM is bipolar, so a bipolar selector is used for this MRAM device. Because of the small read window (RW) of this type of MRAM, a threshold-type selector with low ON resistance is used. The sharp transition between "ON" and "OFF" selector states insures that the RW does not get diminished by adding a selector. Furthermore, because of the low switching voltages of MRAM, a low switching voltage (<1 V) selector is use.

Figure 6B:
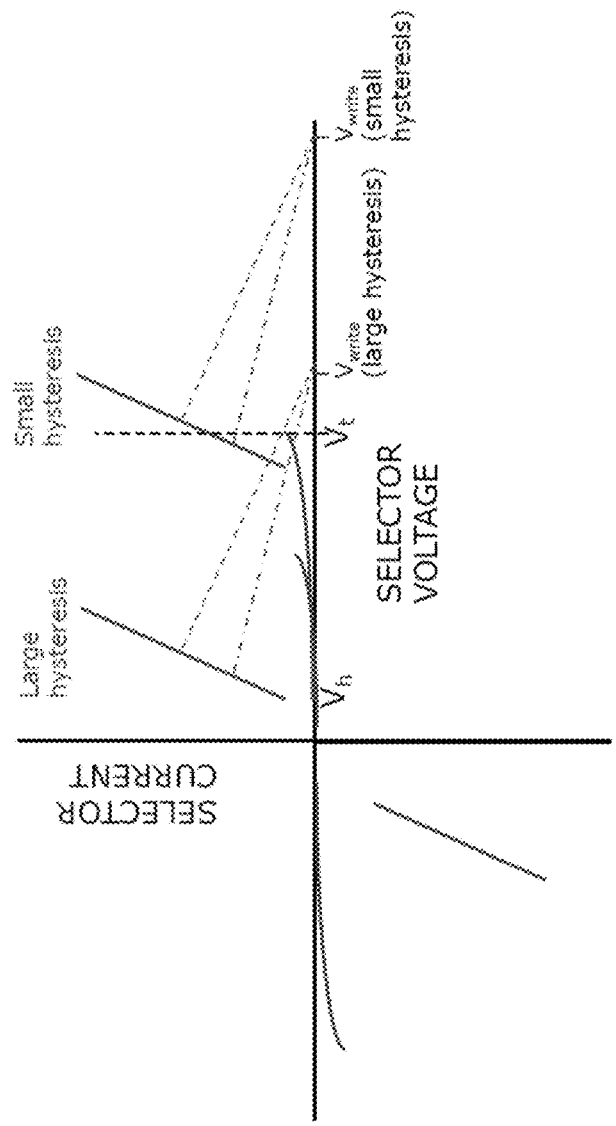

As shown in FIG. 6B, a large hysteresis for the selector of the STT type MRAM is desired for the write operation because the total applied voltage to write is equal to the STT MRAM write voltage (~0.5V) plus the holding voltage ($V_h$). To keep the holding voltage small, a large hysteresis is desired. In contrast, a small hysteresis is desired for the read operation because the voltage across the memory cell after the selector snaps on is equal to the applied voltage plus the holding voltage. This cell voltage is kept as small as possible to minimize read disturb. To keep the holding voltage large, a small hysteresis is desired. However, a single selector cannot provide both the large hysteresis for the write operation and the small hysteresis for the read operation. A selector with "medium" hysteresis also does not solve the above difficulty because it is not optimal for the write voltage or the ready disturb and because it is difficult to control the holding voltage in this case As shown in FIG. 6C, the STT type MRAM is written in two different directions (e.g., the reset step is written in the forward direction with a positive bias and the set step is written in the reverse direction with a negative bias) and read in one direction (e.g., in the reverse direction with smaller negative bias than the set writing step). If the negative read voltage is close to the negative set voltage of the STT type MRAM, then the chance of read disturb increases.

Figure 6D:
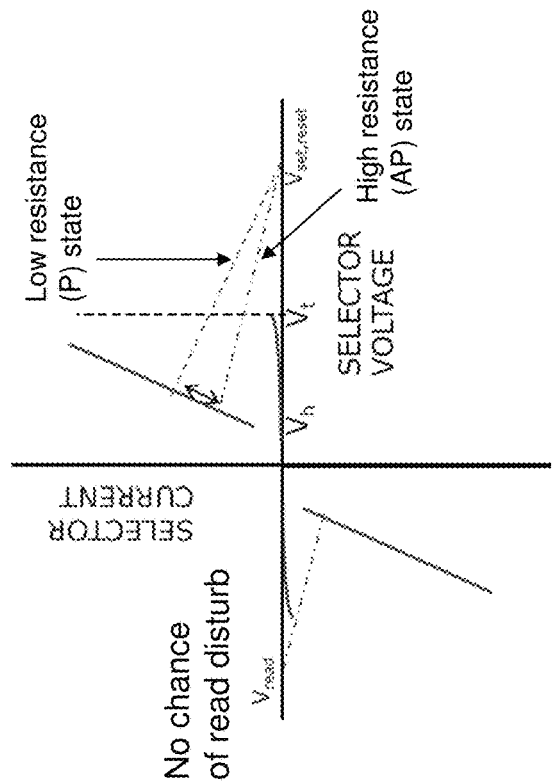
FIGS. 6D and 6E are schematic voltage-current plots of an exemplary two-terminal selector element according to an embodiment of the present disclosure.
Figure 6C:
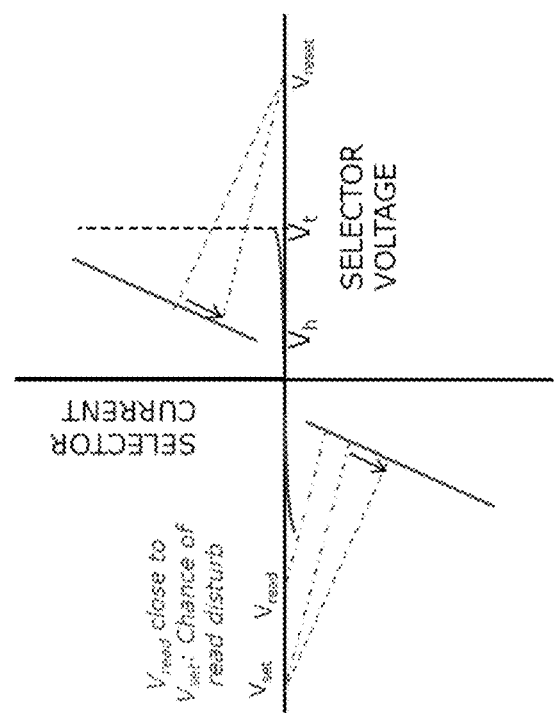

In contrast, as shown in FIG. 6D, since the VCMA type MeRAM is written one direction only (e.g., in the forward direction with the forward bias having a positive voltage on the reference layer 82 and a negative voltage on the free layer 86). The load lines for the low resistance (parallel) and the high resistance (anti-parallel) states are also shown. In an embodiment of the present disclosure, the reading voltage is applied in the opposite (e.g., reverse) direction from the write voltage which causes the VCMA type MeRAM memory cell to become more stable and does not cause a read disturb. Therefore, a two terminal selector element 92 can be used with a large hysteresis window without concern about read disturb.

The two-terminal selector element 92 can have a low switching voltage (less than 1 V, for example) and a large hysteresis. The total applied external bias voltage is divided between the two-terminal selector element 92 and the magnetoelectric memory element 80. By providing the large hysteresis for the two-terminal selector elements 92, the operational voltage of the memory array can be reduced, and the leakage current through unselected memory cells can be minimized Such increase in the hysteresis of the two-terminal selector elements 92 in the configuration of the present disclosure is possible because the write operation employs a reverse bias voltage, which insures the read disturb is non-existent or minimal. In contrast, in prior art spin torque transfer type MRAM devices, use of lager hysteresis is not practical because a high voltage applied across a magnetic tunnel junction can disturb the magnetization of the free layer, and flip the magnetization of the free layer. In contrast, the series connection a two-terminal selector element and of a magnetoelectric memory element comprising a magnetoelectric tunnel junction and positive bias voltage-assisted programming operation of the present disclosure allows application of a high reverse bias voltage across the magnetic tunnel junction without concern for read disturb.

Figure 6E:
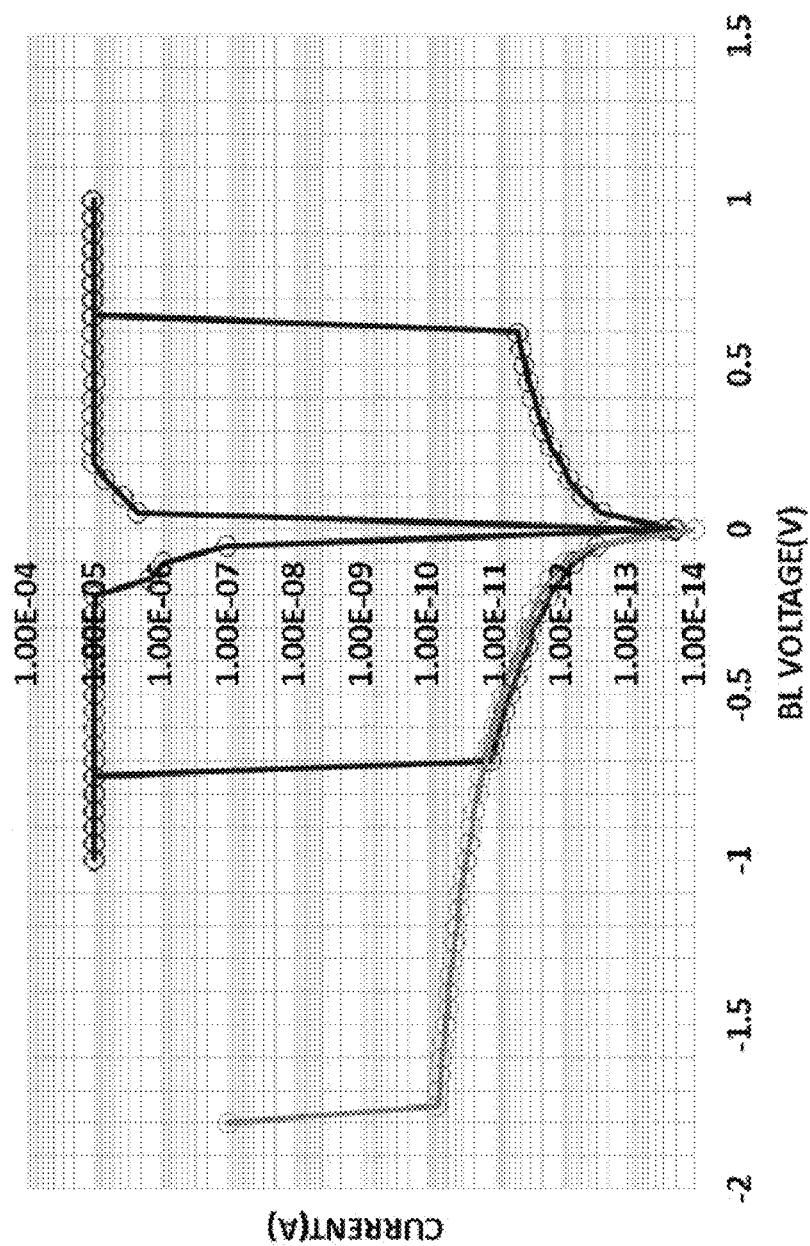

FIG. 6E illustrates a voltage-current plot of an exemplary two-terminal volatile conductive bridge selector element 92. In one embodiment, the two-terminal selector element 92 can comprise a first electrode comprising silver or copper, a second electrode comprising a metal or a conductive metal nitride (e.g., titanium nitride), and a volatile conductive bridge solid electrolyte (e.g., about 3 nm thick hafnium oxide) located between the first electrode and the second electrode. The solid electrolyte may comprise a material other than hafnium oxide, such as silicon or silicon-germanium. FIG. 6E shows the presence of full hysteresis during the write state (right side loop) and during the read state (left side loop) in a conductive bridge containing a silver electrode having a low leakage current and tunable threshold voltage. The branch on the extreme left side of FIG. 6E corresponds to the initial pulse applied to the device. In another embodiment, the two-terminal selector element 92 can comprise another threshold type selector, such as an ovonic threshold switch comprising a chalcogenide material which exhibits hysteresis in both the write and read states. The chalcogenide material may be retained in the amorphous state without being switched into the crystalline state. The chalcogenide material may be a GeTe alloy or a Ge—Se alloy doped with a dopant selected from As, N, and C. In an alternative embodiment, the two-terminal selector element 92 can comprise an element which does not exhibit hysteresis, such as a diode.

Switching of the direction of magnetization of the free layer 86 can be performed by applying an external write voltage above a critical bias voltage of a suitable polarity across the free layer 86 and the reference layer 82. In this case, the polarity of the applied external voltage can be selected such that the perpendicular magnetic anisotropy decreases with the applied bias voltage.

Figure 7:
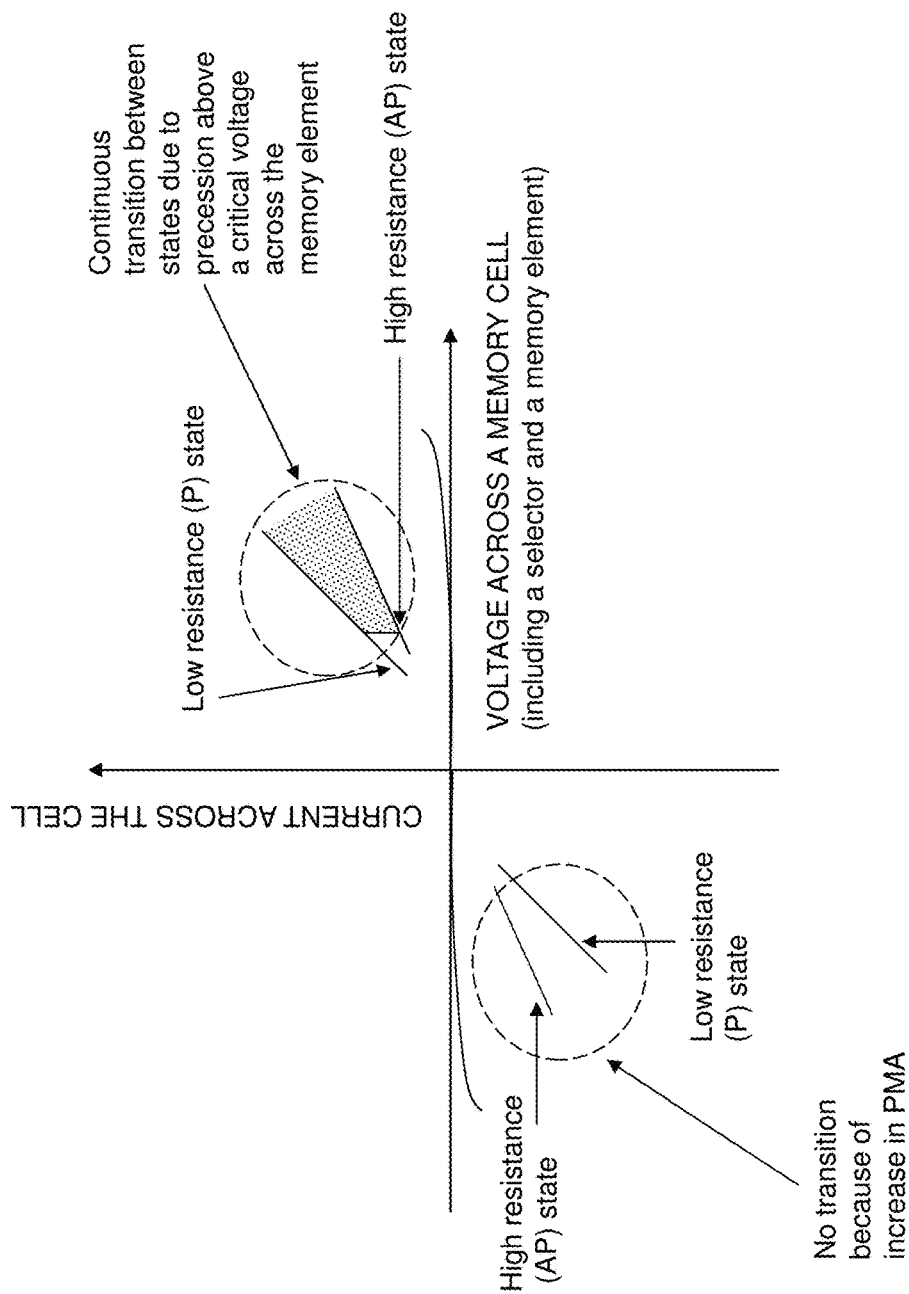
FIG. 7 is a voltage-current characteristic of a resistive memory cell of the present disclosure.

Under the presence of a horizontal (in-plane) magnetic field, application of the external bias voltage greater than the critical bias voltage induces precession of the magnetization of the free layer around the direction of the in-plane magnetic field according to Landau-Lifshitz-Gilbert (LLG) equation known in the art. In this case, continuous application of the forward bias voltage above the critical voltage Vc across the magnetic tunnel junction (82, 84, 86) can cause continuous transition of the magnetization between the parallel state and the antiparallel state as illustrated in FIG. 7. Thus, the transition between the parallel state and the antiparallel state and vice versa can be effected by applying a forward bias voltage pulse of a duration that is about one half of the period of precession of the magnetization of the free layer 86.

The in-plane magnetic field may be provided from an in-stack magnetic bias layer (not expressly shown), or may come from a hard bias magnet (not expressly shown) that is provided around an array of magnetoelectric random access memory cells. In another less preferred embodiment, an external magnetic field can be applied to the memory cells. The optimal magnitude of the in-plane magnetic field can depend on the amplitude of the perpendicular magnetic anisotropy and the coefficients of the voltage controlled magnetic anisotropy (VCMA). The magnitude of the in-plane (horizontal) magnetic field needs to be only moderate. Generally, the magnitude of the in-plane magnetic field can be several times smaller than the magnitude of the perpendicular coercive field at zero bias to compensate the vertical components of the magnetic field from the reference layer 82 and any underlying magnetic layer to substantially zero, and to add additional horizontal components to the horizontal components of the magnetic field from the reference layer 82 and any underlying magnetic layer such that the net horizontal (in-plane) magnetic field has a magnitude of about 10 mT to about 100 mT along the precession axis.

Under such net in-plane magnetic field and application of a forward bias voltage (i.e., a bias voltage that decreases the magnitude of the perpendicular magnetic anisotropy) across the free layer 86 and the reference layer 82 along a direction that decreases the perpendicular magnetic anisotropy of the magnetic tunnel junction, the magnetization of the free layer 86 can precess around the axis of precession with a period on the order of 1 ns, or with a frequency on the order of 1 GHz. The frequency of precession depends on the magnitude of the external horizontal magnetic field and the external bias voltage across the magnetic tunnel junction (82, 84, 86). Thus, by selecting the duration and magnitude of a voltage pulse applied across a given magnetic tunnel junction (82, 84, 86) configured to induce precession of the magnetization of the free layer 86, the magnetization of the free layer 86 can be flipped from the parallel state to the antiparallel state, and vice versa.

The direction of the forward bias voltage, i.e., a bias voltage that decreases the perpendicular magnetic anisotropy of the magnetic tunnel junction (82, 84, 86), is determined by the specific configuration of each magnetic tunnel junction (82, 84, 86). In an illustrative example in which the reference layer 82 includes a 1.4 nm thick CoFeB layer, the insulating tunneling oxide layer 84 includes a 1.4 nm thick MgO layer, and the free layer 86 includes a 1.1 nm thick CoFeB layer, the perpendicular magnetic anisotropy of the magnetic tunnel junction (82, 84, 86) decreases if a negative voltage is applied to the free layer 86 with respect to the reference layer 82.

Because the perpendicular magnetic anisotropy has a significant odd term that is proportional to the applied voltage across the free layer and the reference layer, application of a reverse bias voltage (i.e., an external bias voltage that increases the perpendicular magnetic anisotropy) can inhibit transition of the magnetization between the parallel state and the antiparallel state as illustrated in FIG. 7. Thus, a read operation can be performed by applying a reverse bias voltage and measuring the resistance of the magnetic tunnel junction.

Referring collectively to all of the drawings of the present disclosure, a memory cell 180 comprising a VCMA magnetoelectric memory element 80 connected in series to two-terminal selector element 92 is provided.

The magnetoelectric memory element 80 comprises a magnetoelectric tunnel junction comprising a ferromagnetic reference layer 82, a ferromagnetic free layer 86 and an insulating tunneling oxide layer 84 located between the reference layer and the free layer.

In one embodiment, the memory cell is configured to be written into a set state by application of a first voltage pulse of a first polarity, and to be written into a reset state by application of a second voltage pulse of the first polarity. A magnetization of the free layer 86 is configured to transition from a parallel state with respect to a magnetization of a reference layer 82 to an antiparallel state by application of a first voltage pulse of the first polarity, and to transition from the antiparallel state to the parallel state by application of the second voltage pulse of the first polarity.

In one embodiment, the two-terminal selector element 92 has non-linear voltage-current characteristics in both polarities.

Further, a method of operating a memory cell 180 is provided. The memory cell 180 comprises a two-terminal selector element 92 connected to a magnetoelectric memory element 80 comprising a magnetic tunnel junction (82, 84, 86). The method comprises the steps of: switching a magnetization of a free layer 86 of the magnetic tunnel junction (82, 84, 86) from a parallel state with respect to a magnetization of a reference layer 82 of the magnetic tunnel junction to an antiparallel state by application of a first voltage pulse of a first polarity; switching the magnetization of the free layer 86 from the antiparallel state to the parallel state by application of second voltage pulse of the first polarity, and reading the magnetization of the free layer 86 by applying a bias voltage of a second polarity opposite to the first polarity through the memory cell 180.

The magnetization switching steps (i.e., the writing steps) may be carried out by either a precessional VCMA method or a STT-assisted precessional VCMA method, as described for example in an article by Wang Kang, et al., IEEE Transactions on Nanotechnology, vol. 16, number 3, May 2017, page 387, incorporated herein by reference in its entirety.

In the precessional VCMA method, an external magnetic field is applied to the memory cell 180 and a voltage pulse of the first polarity (e.g., positive voltage) is applied to write the memory cell into the parallel (i.e., lower resistance set) state or antiparallel (i.e., higher resistance reset) state. For example, a shorter duration pulse (e.g., 0.1 to 0.5 ns) can be applied to the memory cell in the antiparallel state to switch it to the parallel state, and a longer duration pulse (e.g., 0.8 to 1.3 ns) can be applied to the memory cell in the parallel state to switch it to the antiparallel state.

Figure 8:
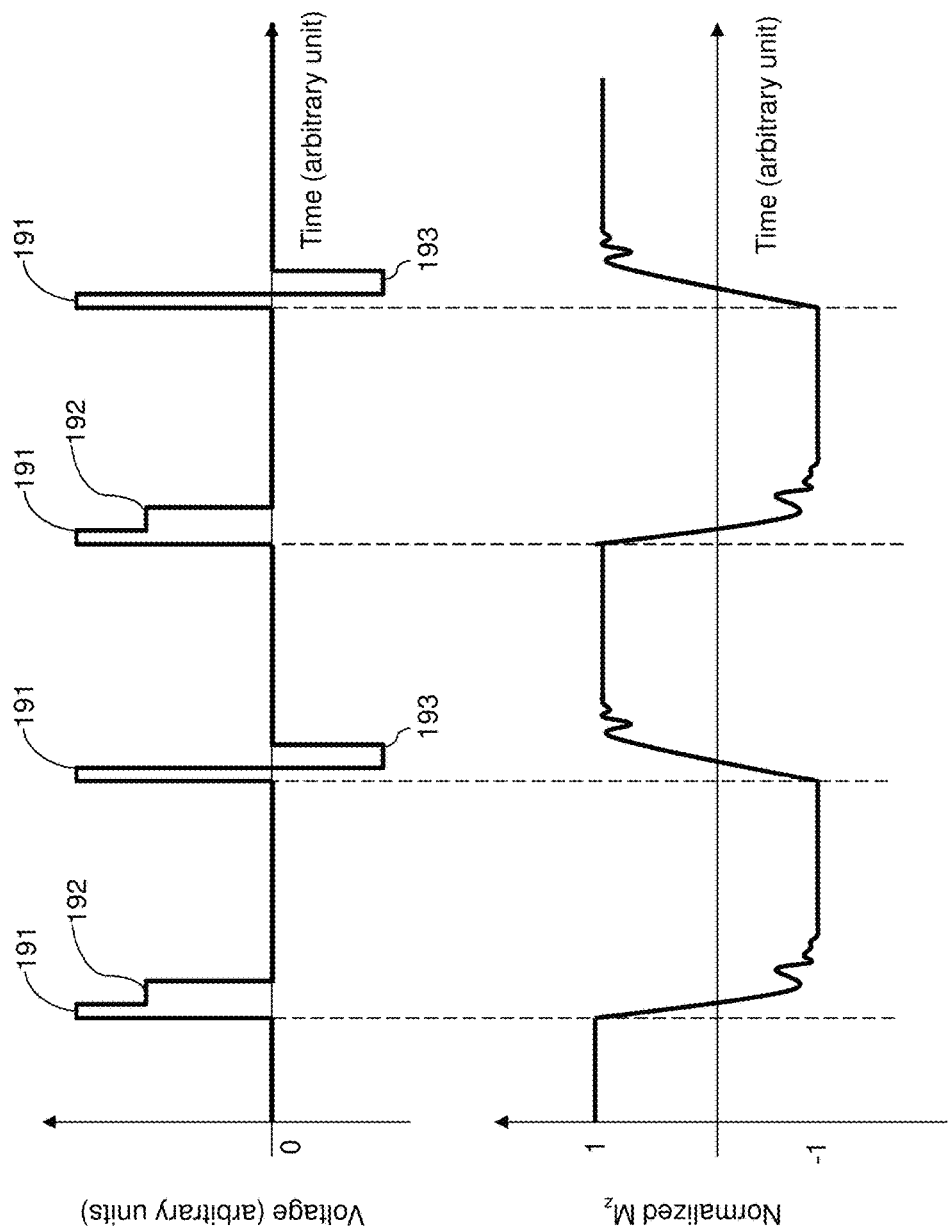
FIGS. 8 and 9 illustrate first and second exemplary programming pulse patterns for inducing changes of magnetization in a free layer according to embodiments of the present disclosure.

In the STT-assisted precessional VCMA method, the external magnetic field may be omitted. In this method, a stopping pulse is applied following the programming pulse to stop the spinning of the free layer magnetization between the parallel and antiparallel states. For example, as shown in FIG. 8, a programming voltage pulse 191 of the first polarity (e.g., a positive voltage) is applied to the memory cell 180 in the antiparallel state (i.e., having the higher $M_z$ value). A first stopping voltage pulse 192 of the same first polarity and a lower magnitude than the programming voltage pulse is then applied to the memory cell 180 to switch the memory cells from the antiparallel state to the parallel state (i.e., having a lower $M_z$ value) by stopping the spinning of the free layer magnetization.

Subsequently, a programming voltage pulse 191 of the first polarity (e.g., a positive voltage) is applied to the memory cell 180 in the parallel state and a second stopping voltage pulse 193 of the second polarity (e.g., a negative voltage) opposite to the first polarity and a lower magnitude than the programming voltage pulse 191 is applied to the memory cell 180 to switch the memory cells from the parallel state to the antiparallel stage. These steps may be repeated as required to program (i.e., write) the memory cell 180 into a desired state. Reading steps may be performed between the programming steps as required.

The stopping pulses (192, 193) may have a longer duration than the programming pulses 191. For example, the stopping pulses (192, 193) may have a duration of 0.3 to 0.5 ns while the programming pulses 191 may have a duration of 0.05 to 0.2 ns.

The respective programming and stopping pulses in FIG. 8 are applied without a temporal break between them. In other words, the value of the programming voltage pulse is reduced to the value of the stopping pulse without a significant (e.g., greater than 0.05 ns) time period between the two pulses.

Figure 9:
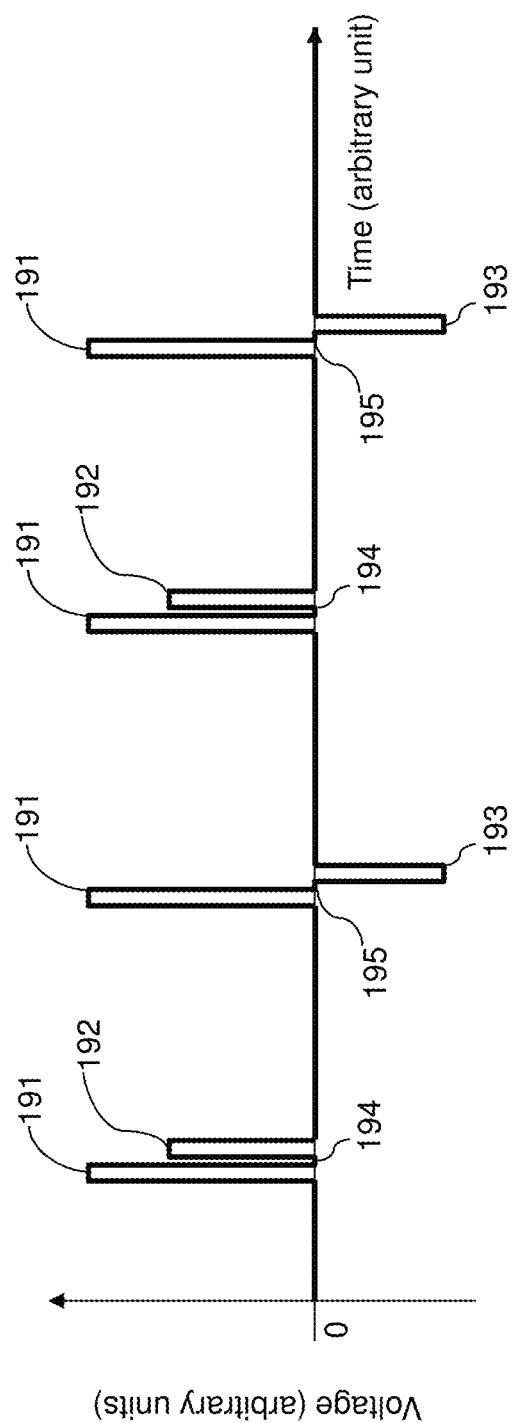

FIG. 9 illustrates a modified STT-assisted precessional VCMA method according to another embodiment. In this method, a zero bias period 194 is provided between the respective programming pulse 191 and the respective stopping pulse 192 or 193. No external voltage is applied to the memory cell 180 during the zero bias period 194 which lasts for at least 0.5 ns.

Various combinations of the programming pulses and stopping pulses illustrated in FIGS. 8 and 9 may be employed. For example, a first programming pulse pattern may include a contiguous positive voltage pulse containing a positive programming pulse portion (a write pulse) 191 and a positive stopping pulse portion (a stop pulse) 192 without the temporal break between them, as shown in FIG. 8. A second programming pulse pattern may include a non-contiguous pair of a positive programming pulse 191 and a negative voltage stopping pulse 193 with a zero bias period 194 between them, as shown in FIG. 9. It may be advantageous to employ the contiguous positive voltage pulse for the first programming pulse pattern since the selector element 92 can be triggered into an on-state by the write pulse, and stays on due to hysteresis during the stop pulse of the first programming pulse pattern. This option provides one more freedom in programming, i.e., the ability to select the voltage level of the stop pulse, which does not need to be above the trigger voltage of the selector element 92. The total write time may be reduced through elimination of a gap between the write pulse and the stop pulse. For the second programming pulse pattern (191, 193), the negative voltage stopping pulse 193 may be similar to the read pulse in terms of the polarity and the magnitude. The selector element 92 turns off between pulses 191 and 193 because the cell will pass through a zero volt state between the second programming pulse 191 and the second stopping pulse 193. Therefore, second programming pulse 191 and the second stopping pulse 193 may not be contiguous in this embodiment.

A method of operating a memory array comprising a plurality of memory cells 180, a plurality of word lines 110, and a plurality of bit lines 120 is also provided. Each memory cell 180 comprises a magnetoelectric memory element 80 connected in series to two-terminal selector element 92. Each of the plurality of memory cells 180 is connected to a respective one of the plurality of word lines 110 and a respective one of the plurality of bit lines 120. Each magnetoelectric memory element 180 comprises a magnetic tunnel junction (82, 84, 86) in which a magnetization of a free layer 86 is in a parallel state or in an antiparallel state with respect to a magnetization of a reference layer 82. The method comprises the steps of: switching a magnetization of a free layer 86 in a first selected magnetoelectric memory element 80S from one of the parallel state and the antiparallel state to another of the parallel state and the antiparallel state through application of a voltage pulse of a first polarity between a word line 110 connected to the first selected magnetoelectric memory element 80S and a bit line 120 connected to the first selected magnetoelectric memory element 80S; and reading a magnetization of the free layer 86 in the first selected magnetoelectric memory element 80S by applying a bias voltage of a second polarity between a word line 110 connected to the first selected magnetoelectric memory element 80S and a bit line 120 connected to the first selected magnetoelectric memory element 80S.

The various devices and methods of the present disclosure provide two terminal selector and MeRAM memory element configuration of each memory cell, which is less complex and less expensive than configuration with a three terminal (e.g., transistor) selector. The memory cell may be in a cross-point MeRAM array which provides a low-cost, fast, non-volatile stand-alone memory. The low write power of the VCMA MeRAM device also provides high bandwidths (>4 GB/sec for both read and write steps).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A memory cell, comprising:
a VCMA magnetoelectric memory element; and
a two-terminal selector element connected in series to the magnetoelectric memory element;
wherein:
the magnetoelectric memory element comprises a magnetoelectric tunnel junction comprising a ferromagnetic reference layer, a ferromagnetic free layer and an insulating tunneling oxide layer located between the reference layer and the free layer;

the memory cell is configured to be written into a set state by application of a first voltage pulse of a first polarity, and to be written into a reset state by application of a second voltage pulse of the first polarity;

the memory cell is configured to be read by application of a third voltage of a second polarity opposite to the first polarity;

a magnetization of the free layer is configured to transition from a parallel state with respect to a magnetization of the reference layer to an antiparallel state by application of the first voltage pulse of the first polarity followed by an application of a stopping voltage pulse of the second polarity opposite to the first polarity and lower magnitude than the first voltage pulse; and the magnetization of the free layer is configured to transition from the antiparallel state to the parallel state by application of the second voltage pulse of the first polarity followed by an application of a stopping voltage pulse of the first polarity and lower magnitude than the second voltage pulse.

2. The memory cell of claim 1, wherein the two-terminal selector element has non-linear voltage-current characteristics in both polarities and exhibits hysteresis.

3. The memory cell of claim 2, wherein the two-terminal selector element comprises a threshold selector element, the ferromagnetic reference layer comprises a first CoFeB layer, the ferromagnetic free layer comprises a second CoFeB layer, and the insulating tunneling oxide layer comprises an MgO layer.

4. The memory cell of claim 2, wherein the two-terminal selector element comprises a volatile conductive bridge.

5. The memory cell of claim 2, wherein the two-terminal selector element comprises a chalcogenide ovonic threshold switch.

6. A two-dimensional memory array comprising a plurality of bit lines and a plurality of word lines arranged in a cross point configuration, comprising a respective memory cell of claim 1 connected to a respective one of the plurality of bit lines and a respective one of the plurality of word lines at each intersection region of the two-dimensional memory array.

7. A memory cell, comprising:
a VCMA magnetoelectric memory element; and
a two-terminal selector element connected in series to the magnetoelectric memory element;
wherein:

the magnetoelectric memory element comprises a magnetoelectric tunnel junction comprising a ferromagnetic reference layer, a ferromagnetic free layer and an insulating tunneling oxide layer located between the reference layer and the free layer;

the memory cell is configured to be written into a set state by application of a first voltage pulse of a first polarity, and to be written into a reset state by application of a second voltage pulse of the first polarity;

the memory cell is configured to be read by application of a third voltage of a second polarity opposite to the first polarity;

a magnetization of the free layer is configured to transition from a parallel state with respect to a magnetization of the reference layer to an antiparallel state by application of the first voltage pulse of the first polarity, followed by a zero bias period, and followed by an application of a stopping voltage pulse of the second polarity opposite to the first polarity and lower magnitude than the first voltage pulse; and the magnetization of the free layer is configured to transition from the antiparallel state to the parallel state by application of the second voltage pulse of the first polarity, followed by the zero bias period, and followed by an application of a stopping voltage pulse of the first polarity and lower magnitude than the second voltage pulse.

8. The memory cell of claim 7, wherein the two-terminal selector element has non-linear voltage-current characteristics in both polarities and exhibits hysteresis.

9. The memory cell of claim 8, wherein the two-terminal selector element comprises a threshold selector element, the ferromagnetic reference layer comprises a first CoFeB layer, the ferromagnetic free layer comprises a second CoFeB layer, and the insulating tunneling oxide layer comprises an MgO layer.

10. The memory cell of claim 8, wherein the two-terminal selector element comprises a volatile conductive bridge.

11. The memory cell of claim 8, wherein the two-terminal selector element comprises a chalcogenide ovonic threshold switch.

12. A two-dimensional memory array comprising a plurality of bit lines and a plurality of word lines arranged in a cross point configuration, comprising a respective memory cell of claim 7 connected to a respective one of the plurality of bit lines and a respective one of the plurality of word lines at each intersection region of the two-dimensional memory array.

* * * * *